US010483878B2

(12) United States Patent
Heinz

(10) Patent No.: US 10,483,878 B2
(45) Date of Patent: Nov. 19, 2019

(54) ELECTRO-ADHESION GRIPPERS WITH FRACTAL ELECTRODES

(71) Applicant: TRUMPF GmbH + Co. KG, Ditzingen (DE)

(72) Inventor: Alexander Heinz, Vaihingen an der Enz (DE)

(73) Assignee: TRUMPF GmbH + Co. KG, Ditzingen (DE)

( * ) Notice: Subject to any disclaimer, the term of this patent is extended or adjusted under 35 U.S.C. 154(b) by 0 days.

(21) Appl. No.: 16/130,262

(22) Filed: Sep. 13, 2018

(65) Prior Publication Data

US 2019/0013746 A1 Jan. 10, 2019

Related U.S. Application Data

(63) Continuation of application No. PCT/EP2017/058344, filed on Apr. 7, 2017.

(30) Foreign Application Priority Data

Apr. 13, 2016 (DE) .................. 10 2016 206 193

(51) Int. Cl.
*H02N 13/00* (2006.01)
*B25J 15/00* (2006.01)
*H01L 21/683* (2006.01)

(52) U.S. Cl.
CPC .......... *H02N 13/00* (2013.01); *B25J 15/0085* (2013.01); *H01L 21/6833* (2013.01); *H01L 21/6835* (2013.01)

(58) Field of Classification Search
CPC . H02N 13/00; H01L 21/6833; H01L 21/6835; B25J 15/0085

USPC ......................................................... 361/234
See application file for complete search history.

(56) References Cited

U.S. PATENT DOCUMENTS

| 2008/0011509 A1 | 1/2008 | Baliarda et al. |
| 2008/0089002 A1 | 4/2008 | Pelrine et al. |
| 2008/0169003 A1 | 7/2008 | Curtis |
| 2008/0278883 A1 | 11/2008 | Norio et al. |
| 2013/0118780 A1 | 5/2013 | Zhang |

(Continued)

FOREIGN PATENT DOCUMENTS

| CN | 203889500 | 10/2014 |
| CN | 205021603 | 2/2016 |

(Continued)

OTHER PUBLICATIONS

Ruffato et al. "Optimization and experimental validation of electrostatic adhesive geometry" Aerospace Conference, 2013, 1-8.

(Continued)

*Primary Examiner* — Kevin J Comber
(74) *Attorney, Agent, or Firm* — Fish & Richardson P.C.

(57) ABSTRACT

Electro-adhesion grippers for holding workpieces, are disclosed as including a first electrode and a second electrode that mutually engage, in a plan view of the electrodes, wherein, at least in a sub-region, the first electrode and the second electrode correspond to the border lines of a two-dimensional fractal space-filling curve of a second or higher order, and wherein the border lines result from enclosing a shape of the space-filling curve on both sides on an auxiliary grid that is offset with respect to a grid of the space-filling curve by half a grid spacing in each grid direction.

18 Claims, 8 Drawing Sheets

(56) References Cited

U.S. PATENT DOCUMENTS

2014/0272272 A1    9/2014   Spenko et al.
2015/0124369 A1    5/2015   Thiel et al.
2016/0035611 A1    2/2016   Kutter et al.

FOREIGN PATENT DOCUMENTS

| DE | 69523393 | 5/2002 |
| DE | 10 2012 212 465 | 11/2013 |
| DE | 102014215333 | 8/2015 |
| EP | 1909308 | 4/2008 |
| EP | 2413347 | 2/2012 |
| FR | 2833969 | 6/2003 |
| WO | WO 9525689 | 9/1995 |
| WO | WO 2007/143662 | 12/2007 |
| WO | WO 2014/048916 | 4/2014 |
| WO | WO 2014/144599 | 9/2014 |

OTHER PUBLICATIONS

International Search Report and Written Opinion in International Application No. PCT/EP2017/058344, dated Jun. 28, 2017, 15 pages (with English translation).
CN Office Action in Chinese Appln. No. 201780022970.3, dated Jul. 22, 2019, 12 pages (with English translation).

ELECTRO-ADHESION GRIPPERS WITH FRACTAL ELECTRODES

CROSS REFERENCE TO RELATED APPLICATIONS

This application is a continuation of and claims priority under 35 U.S.C. § 120 from PCT Application No. PCT/EP2017/058344 filed on Apr. 7, 2017, which claims priority from German Application No. DE 10 2016 206 193.3, filed on Apr. 13, 2016. The entire contents of each of these priority applications are incorporated herein by reference.

TECHNICAL FIELD

The disclosure relates to electroadhesion grippers for holding workpieces.

BACKGROUND

Electroadhesion grippers are used to secure workpieces to an adhesion surface, for example for transporting the workpieces in industrial production processes such as linked production processes. Generally, at least one electrode is created on an adhesion surface, to which a high voltage is applied such that a strong electric field is generated between the electrode and the environment. A workpiece abutting the adhesion surface is adhered to the adhesion surface when the electric field is switched on, due to electrostatic attraction to opposite charges that are induced in the workpiece. The electrode can be protected from direct contact with the workpiece by a thin insulating film. In the case of a conductive workpiece, two electrodes are typically used, to which an alternating high voltage is applied.

Typical electrodes for electroadhesion grippers have a comb-like structure. The holding force on a workpiece, parallel to the adhesion plane, has a preferred direction; the holding force is considerably smaller in parallel with the teeth of the comb than perpendicular to the teeth. This anisotropy is generally undesirable, such as when the orientation of workpieces to be gripped varies, since the holding force can be very small in unfavorable circumstances, e.g., too small for a secure grip. Typical electroadhesion grippers are disclosed for example in WO 2007/143662 A2, DE 695 23 393 T2 or DE 10 2014 215 333 B3.

SUMMARY

The disclosure provides electroadhesion grippers by means of which a direction-independent, large holding force can be reliably applied to a workpiece parallel to the adhesion surface.

Electroadhesion grippers for holding workpieces include a first electrode and a second electrode that are designed to mutually engage (as seen in a plan view of the electrodes), wherein, at least in a sub-region in the plan view of the electrodes, the first electrode and the second electrode correspond to border lines of a two-dimensional fractal space-filling curve of a second or higher order.

The electrodes of the electroadhesion grippers described herein are formed on the basis of a fractal pattern. The fractal pattern makes it possible to effectively avoid preferred directions in the holding force parallel to the adhesion surface. This advantage also applies to workpieces that are gripped outside of a center of the electrode or that are considerably smaller than the electroadhesion surface.

The first and the second electrodes correspond to the border lines (i.e., a surround) surrounding a two-dimensional fractal space-filling curve, or the relevant parts of the surround. The two electrodes do not correspond to the space-filling curve themselves, but rather to the surround of the fractal space-filling curve. Thereby it is possible to manage with particularly small insulation widths between the electrodes or with a particularly small proportion of insulation surfaces between the electrodes in comparison with the adhesion surface as a whole. This makes it possible to have higher electric field strengths and/or larger electrode lengths, which can be used for a larger holding force. A bipolar electrode geometry is particularly suitable for electroadhesion as described herein.

The electroadhesion grippers described herein can be used universally for different workpiece sizes, workpiece geometries, and workpiece orientations. The electroadhesion grippers can also be flexible electroadhesion grippers (having a flexible insulation layer, optionally also a flexible support structure).

In principle, the electrode geometries can be of any desired small scale (on account of a correspondingly large dimension of the space-filling curve). The electrodes do not have a regular, large-scale pattern. The electric fields in the intermediate space between the electrodes are oriented so as to differ as significantly as possible. Typical stamped/laser parts that are handled using the electroadhesion gripper have a fractal dimension between 1.3 and 1.6, and thus a dimension that differs significantly from the electrodes of the gripper (having a dimension of 2). A maximum number of electrode gaps can be evenly covered by the workpiece in all directions.

The border lines result from enclosing the shape of the space-filling curve on both sides on an auxiliary grid that is offset with respect to a grid of the space-filling curve by half a grid spacing in each grid direction. The enclosure is interrupted at (at least) two points for a division into the two electrodes. Preferably, the starting point (the first end) and the end point (the second end) of the space-filling curve are not completely enclosed. This configuration results in two separate structures of continuous border lines for the two electrodes. The border lines also result from a maximum broadening of the space-filling curve, such that the curve runs into itself, from the outer contour of the space-filling curve, with an interruption being provided, e.g., at the starting point and end point of the space-filling curve.

The fractal space-filling curve is generally based on a base element (a base curve, or generator) that is defined by linearly interconnected points on a grid (for example a "U" in a 2×2 grid in the case of a Hilbert curve). When transitioning into the next, higher order, each grid point of a base element is replaced by a downscaled base element. The downscaled base elements are oriented such that the starting and end points thereof are adjacent to one another for a mutual connection, in accordance with the connection of the grid points of the replaced (larger) base element. The base element alone constitutes the first order (iteration) of the space-filling curve. The second order (iteration) is obtained after replacing the grid points of the base element with downscaled base structures, and the third order (iteration) is obtained by replacing the grid points of the downscaled base structures, and so on. Fractal base structures are described for example in the following documents: EP 2 413 347 A1, and US 2014/0272272 A1.

The shape of the electrodes corresponds to the border lines of the fractal space-filling curve thus formed when seen in a plan (or projection) view of the electrodes by looking at the adhesion surface of the electroadhesion gripper that faces the workpiece in a direction perpendicular to the adhesion surface. In this plan view (projection), the electrodes also mutually engage. The electrodes can be arranged in a common plane or also in different planes; the distribution of a particular electrode over a plurality of planes is also possible, if desired.

In some embodiments of the electroadhesion grippers described herein, the first electrode and the second electrode correspond to a first part and a second part of the border lines of the space-filling curve, wherein the first part and the second part of the border lines are separated from one another in the region of a starting point and in the region of an end point of the space-filling curve. In the case of an interruption of the border lines at the starting point and at the end point of the space-filling curve, the border lines surrounding the space-filling curve can be divided into two electrodes, such that in total only two terminals are required for the two electrodes. Each portion of the space-filling curve is enclosed by different electrodes on both sides thereof, including at the starting point and at the end point, such that changes of the direction of the local electric field can take place in a space that is as small as possible.

An embodiment in which the space-filling curve is of a third or higher order, e.g., of a fourth or higher order, is particularly advantageous. This configuration makes it possible to grip securely structures that are very small, even in comparison with the electrodes.

In some embodiments, the space-filling curve is a Hilbert curve. Electrode designs based on a Hilbert curve are comparatively simple to plan and implement. Alternatively, other types of space-Filling, self-Avoiding, Simple, self-Similar (FASS) curves, for instance a Peano curve, can also be used as space-filling curves. Space-filling curves of which the base element can be represented on a 2×2 or 3×3 grid are generally preferred.

In some embodiments, the electroadhesion gripper includes exactly two electrodes, namely the first electrode and the second electrode. This arrangement results in simple construction of the electroadhesion gripper. In particular, only two terminals are required in the common plane of the electrodes.

In some embodiments, the first electrode and the second electrode are rounded-off at ends and/or corners of the respective border lines thereof. This configuration avoids field strength peaks or arcing occurring at the electrodes in the case of high voltages. The radius of curvature at the rounded-off portions can be greater than 1/10 the local width of the electrode, e.g., greater than ¼ the local width of the electrode.

In some embodiments, there is a small spacing between the first electrode and the second electrode (as seen in the plan view of the electrodes) that is 3.0 mm or less, e.g., 1.0 mm or less, or 0.3 mm or less. A small spacing allows high electric field strengths and thus large holding forces to be achieved. The small spacings are particularly suitable for typical applications, such as gripping metal sheets.

In some embodiments, the first electrode and the second electrode have a uniform width in the sub-region. This configuration simplifies the construction and ensures an even distribution of the holding force in the adhesion surface. Local peaks in current strength are avoided.

In some embodiments, the first electrode and/or the second electrode are printed onto a dielectric insulating film and the film is glued to a holding structure. This production method has proven successful in practice and can also be implemented effectively using the electrode construction.

The holding structure can be attached to an automation unit (having a robotic arm, for instance).

An embodiment in which, in the sub-region, the first electrode and the second electrode are arranged in a common plane is also advantageous. This configuration is simple to produce, and particularly high field strengths can be produced for a large holding force.

An embodiment in which, in the sub-region, the first electrode is arranged in a first plane and the second electrode is arranged in a second plane, wherein the first plane and the second plane are coplanar and mutually spaced, is also advantageous. In this design, it is particularly simple to ensure insulation between the electrodes; the construction is also comparatively simple. The spacing between the two planes, measured perpendicularly to the planes, is usually about 10 μm to 200 μm, and is often determined by the thickness of a plastic film.

Further advantages of the invention can be found in the description and the drawings. The features that have been mentioned above and those to be mentioned below can, in each case, be used in isolation or as a plurality in any desired combination. The embodiments shown and described herein are not to be interpreted as a conclusive list, but rather are of an exemplary nature for illustrating the invention.

DETAILED DESCRIPTION

Figure 1:
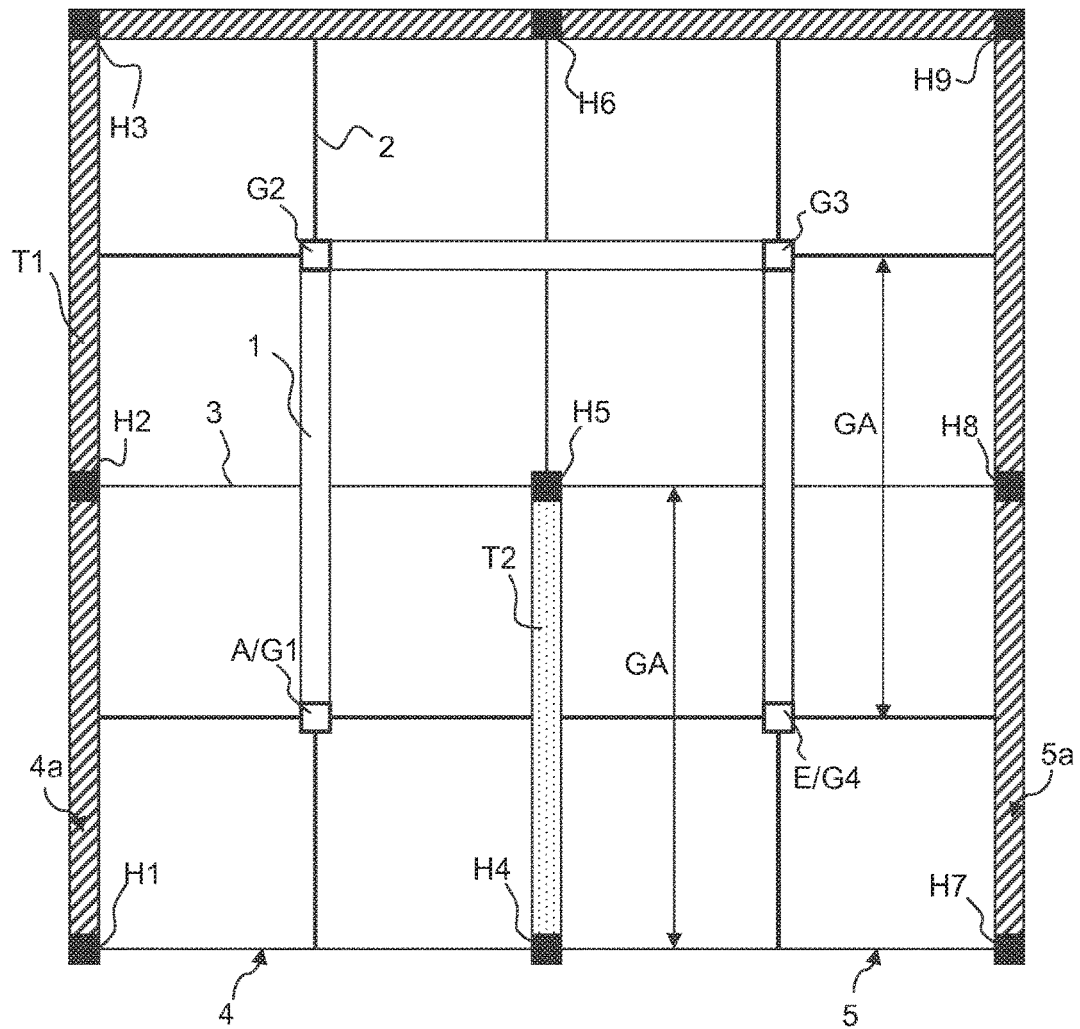
FIG. 1 schematically shows a first order Hilbert curve with surrounding border lines, to explain the construction of an electrode geometry.

FIG. 1 shows (by white, unfilled bars) a first order Hilbert curve 1 (the base curve, or generator). The order is also referred to as an iteration. On a grid 2 (indicated by thick black lines), four grid points G1, G2, G3, G4 are arranged in a square (so called 2×2 arrangement). The grid points G1-G4 (indicated by empty white squares) are connected linearly by the Hilbert curve 1. The first order Hilbert curve 1 is in the shape of a U (upside down in this case), which begins at a starting point A, at grid point G1, and ends at an end point E, at grid point G4.

A total of nine auxiliary grid points H1-H9 (indicated by black squares) are in a square pattern on an auxiliary grid 3 (indicated by thin black lines) in this case. The auxiliary grid 3 has a grid spacing GA that is identical in terms of magnitude to the grid 2, but is offset with respect thereto by half a grid spacing in both grid directions of the grid 2 (i.e., to the right and towards the top).

The shape of the first order Hilbert Curve 1 can be surrounded by border lines on the auxiliary grid 3. Note that only auxiliary grid points H1-H9 that are (diagonally) adjacent to grid points G1-G4 of the grid are required. The border lines interconnect all the auxiliary grid points H1-H9 which are straight adjacent (to the left or right or towards the top/bottom) to one another in the auxiliary grid 3 and of which the particular connection is not crossed by the Hilbert curve 1. In doing so, however, at least one border-side connection 4 at the starting point A (at grid point G1) and a border-side connection 5 at the end point E (at grid point G4) are left open. Note that, alternatively, the connections 4a, 5a could also be left open instead of connections 4, 5, or all of connections 4, 4a, 5, 5a could be left open.

The enclosure results in a first part T1 (indicated by cross-hatches) of the border lines that in this case connects the auxiliary grid points H1, H2, H3, H6, H9, H8, H7 along the auxiliary grid 3. The enclosure further results in a second part T2 (indicated by dots) of the border lines that in this case connects the auxiliary grid points H4, H5 along the auxiliary grid 3.

Figure 2:
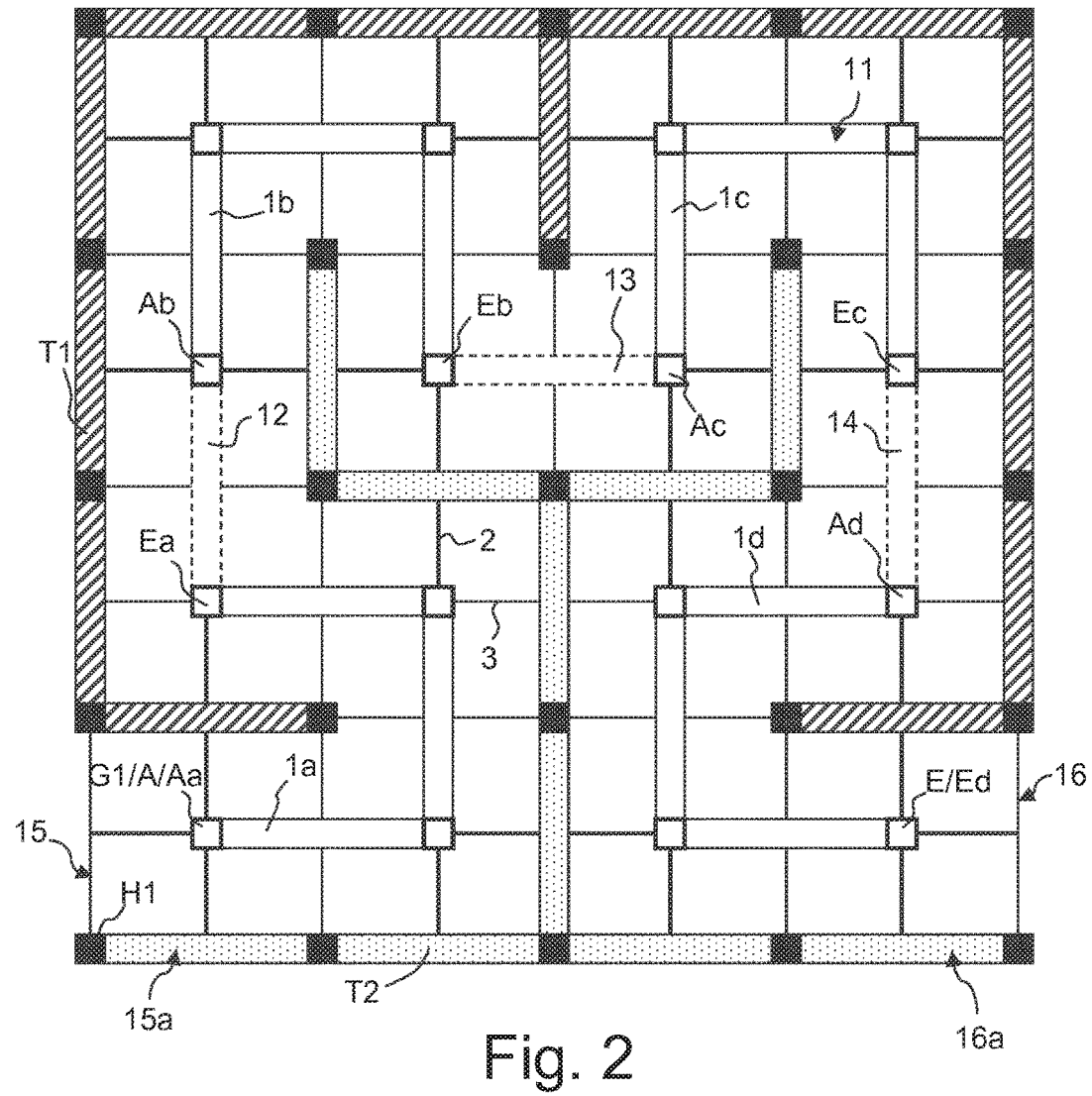
FIG. 2 schematically shows a second order Hilbert curve with surrounding border lines, to explain the construction of an electrode geometry.

FIG. 2 shows a second order Hilbert curve 11. Each of grid points G1-G4 from FIG. 1 is replaced by a first order Hilbert curve 1a-1d that has been accordingly downscaled (in this case by a factor of 2). The downscaled first order Hilbert curves 1a-1d are connected by their starting points Aa-Ad and end points Ea-Ed via connections 12, 13, 14 in the same way as the grid points G1-G4 were connected in the originally oriented first order Hilbert curve 1 of the previous iteration (see FIG. 1). Each downscaled first order Hilbert curve 1a-1d therefore is oriented accordingly, for example by rotation and/or mirroring (with rotation being sufficient in this case). Specifically, the Hilbert curve 1a (formerly grid point G1) is connected to the Hilbert curve 1b (formerly grid point G2) by the connection 12. Furthermore, the Hilbert curve 1b (formerly grid point G2) is connected to the Hilbert curve 1c (formerly grid point G3) by the connection 13. Finally, the Hilbert curve 1c (formerly grid point G3) is connected to the Hilbert curve 1d (formerly grid point G4) by the connection 14. This process is an iterative design of two-dimensional fractal space-filling curves (such as the Hilbert curve).

For the second order Hilbert curve 11, the total of 16 grid points of which (white-filled squares, with G1 being indicated as an example) are in in turn on a grid 2 (having thick black lines), the border lines can be added in turn. For this purpose, an auxiliary grid 3 (having thin black lines) that is offset with respect to the grid 2 by half a grid spacing in each grid direction and that includes auxiliary grid points (filled-in black squares, with H1 being indicated as an example) is used. For the design of the border lines, all the auxiliary grid points that are (straight) adjacent to one another are interconnected insofar as the connection thereof does not cross the Hilbert curve 11 (including the connections 12, 13, 14 thereof). At least one outer connection 15, 16 remains open in each case adjacent to the grid point of the starting point A and the grid point of the end point E of the Hilbert curve 11; alternatively or additionally, the connections 15a, 16a could also remain open.

A first part T1 of the border lines (indicated by cross-hatches) and a second part T2 of the border lines (indicated by dots) are produced that are separate from one another. The parts T1 and T2 of the border lines with respect to the second order Hilbert curve 11 can already be used for a design of electrodes of an electroadhesion gripper. An at least third order space-filling curve is often taken as the basis for the electrode design, however.

Figure 3:
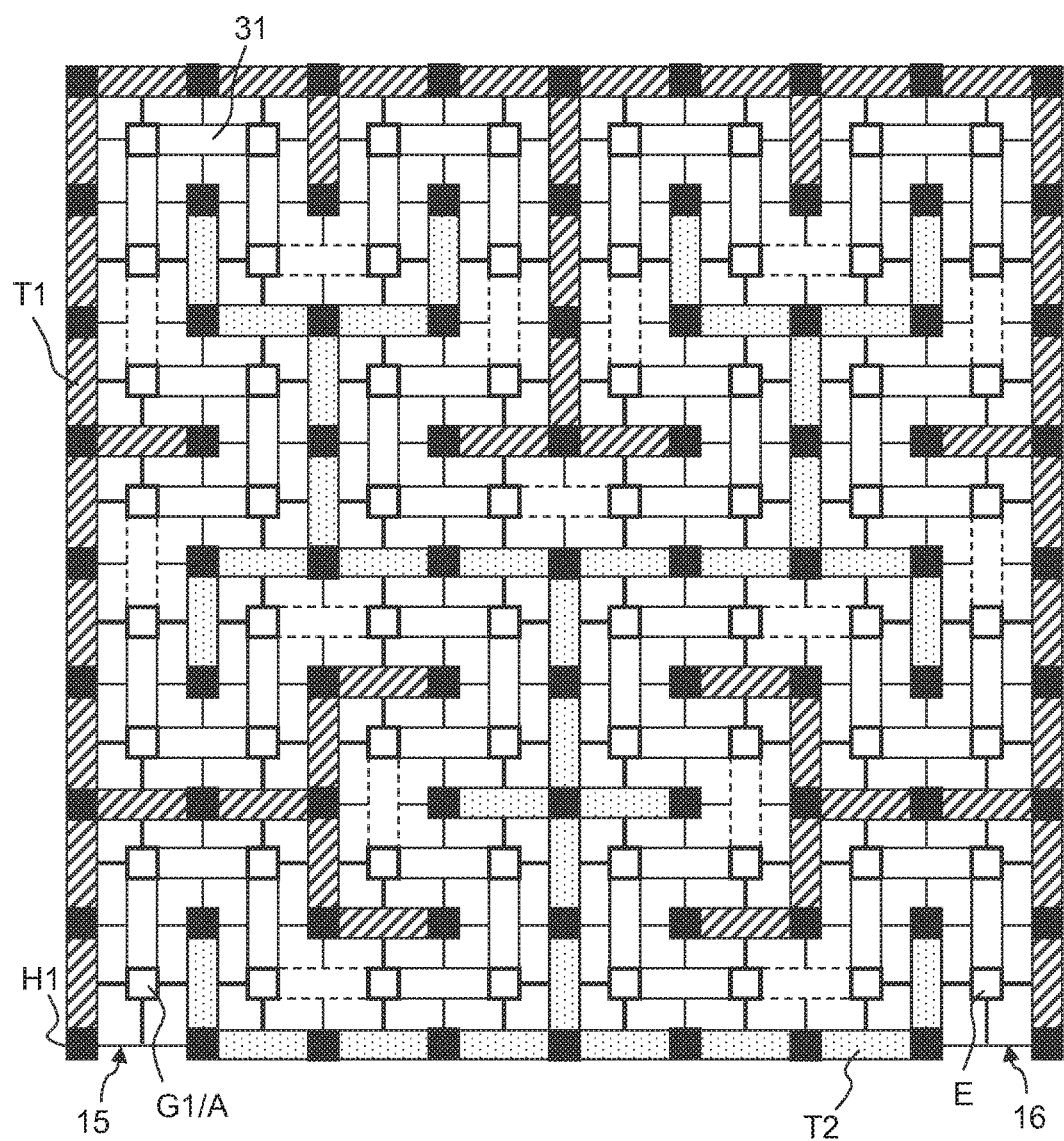
FIG. 3 schematically shows a third order Hilbert curve with surrounding border lines, to explain the construction of an electrode geometry.

The transition of the design from the second to the third order (and higher orders accordingly) of the Hilbert curve can be implemented analogously to the transition from the first to the second order. FIG. 3 shows the design of the third order Hilbert curve 31, each of the grid points (empty white squares in FIG. 2) of the second order Hilbert curve 11 having been replaced by a downscaled first order Hilbert curve that is suitably oriented for incorporating the connections provided in the second order Hilbert curve 11. The third order Hilbert curve 31 extends in a space-filling manner over a total of 64 grid points (see white squares, with grid point G1 as an example).

The border lines including the two separate parts T1 and T2 can be obtained by means of an auxiliary grid 3 that is offset with respect to the grid 2 of the third order Hilbert curve 31 by half a grid spacing in each direction, together with the auxiliary grid points thereof (black squares, with the auxiliary grid point H1 as an example). The (straight) adjacent auxiliary grid points are connected without crossing the Hilbert curve 31, the connections 15, 16 at the starting point A and at the end point E being left open in this case.

Note that each auxiliary grid point on the part T1 has at least one diagonally or straight adjacent auxiliary grid point on the part T2, and vice versa.

Figure 4:
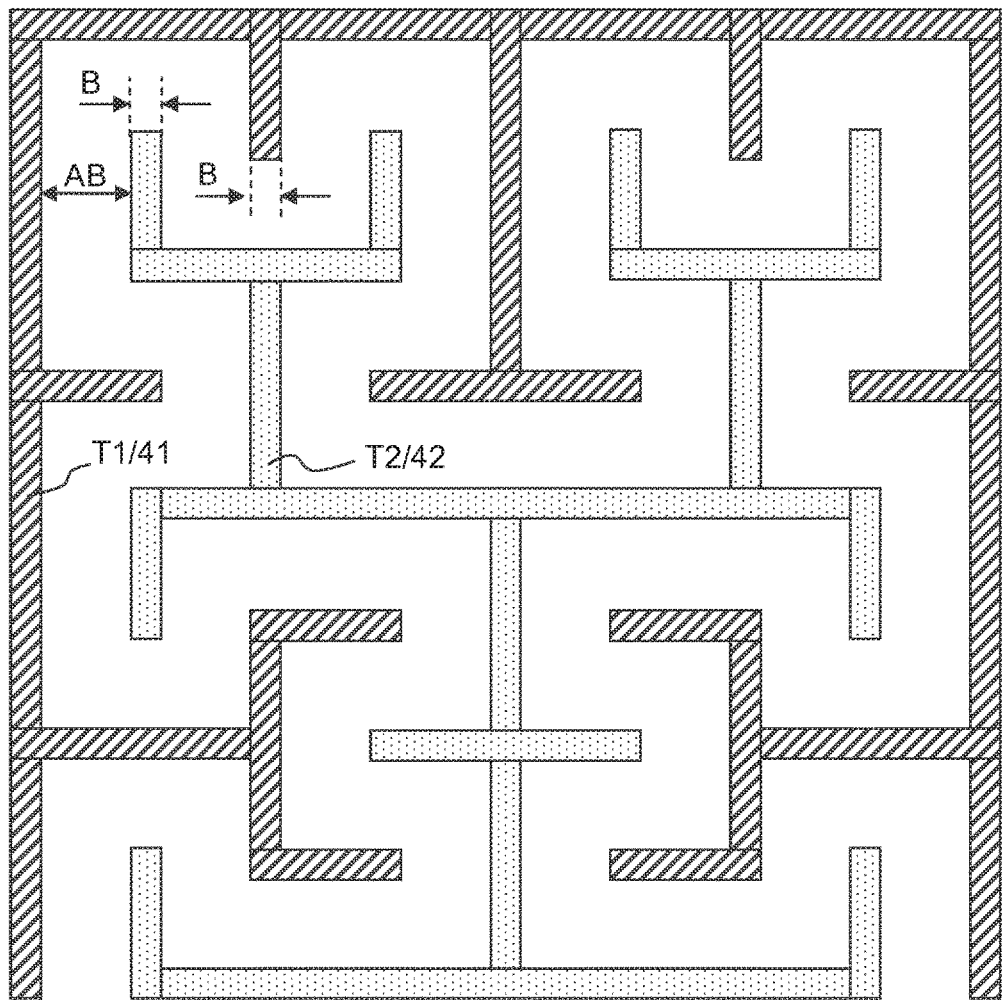
FIG. 4 schematically shows an electrode geometry, derived from FIG. 3, for an electroadhesion gripper.

For the sake of clarity, only parts T1 (in cross-hatches) and T2 (in dots) from FIG. 3 are shown in FIG. 4. The parts can be used as a template for the geometry of a first electrode 41 and a second electrode 42 for an electroadhesion gripper as described herein. The electrodes 41, 42 are shown in plan view from an adhesion surface of the electroadhesion gripper that faces the workpiece; the two electrodes 41, 42 are in a common plane (alternatively, however, the electrodes can also be arranged in planes that are one behind the other, for example). The space between the electrodes 41, 42 is used for providing electrical insulation between the electrodes and, for example, can be filled with an insulating plastics material or may simply be left free.

The electrodes 41, 42 most often consist of copper, gold, or silver, or alloys containing these metals. Note that the width B of the electrodes 41, 42 can be selected, in principle, as desired (provided that the required spacing for insulation between the electrodes 41, 42 remains). Usually, however, the widths B of the electrodes 41, 42 are the same for both electrodes 41, 42 and also the same within a particular electrode 41, 42. Accordingly, the smallest spacing AB between the electrodes 41, 42 is usually the same all over (also as seen in a plan view of the electrodes 41, 42).

When using high voltages between the electrodes 41, 42, the corners of the electrodes 41, 42 (including the corners at the ends of the electrodes 41, 42) can be rounded-off. In the design shown in FIG. 5, which largely corresponds to the design in FIG. 4, all the outer corners are rounded-off, in this case with a radius of curvature corresponding to half the electrode width. The inner corners are rounded-off in the same way. Arcing is avoided or made difficult as a result.

Figure 5:
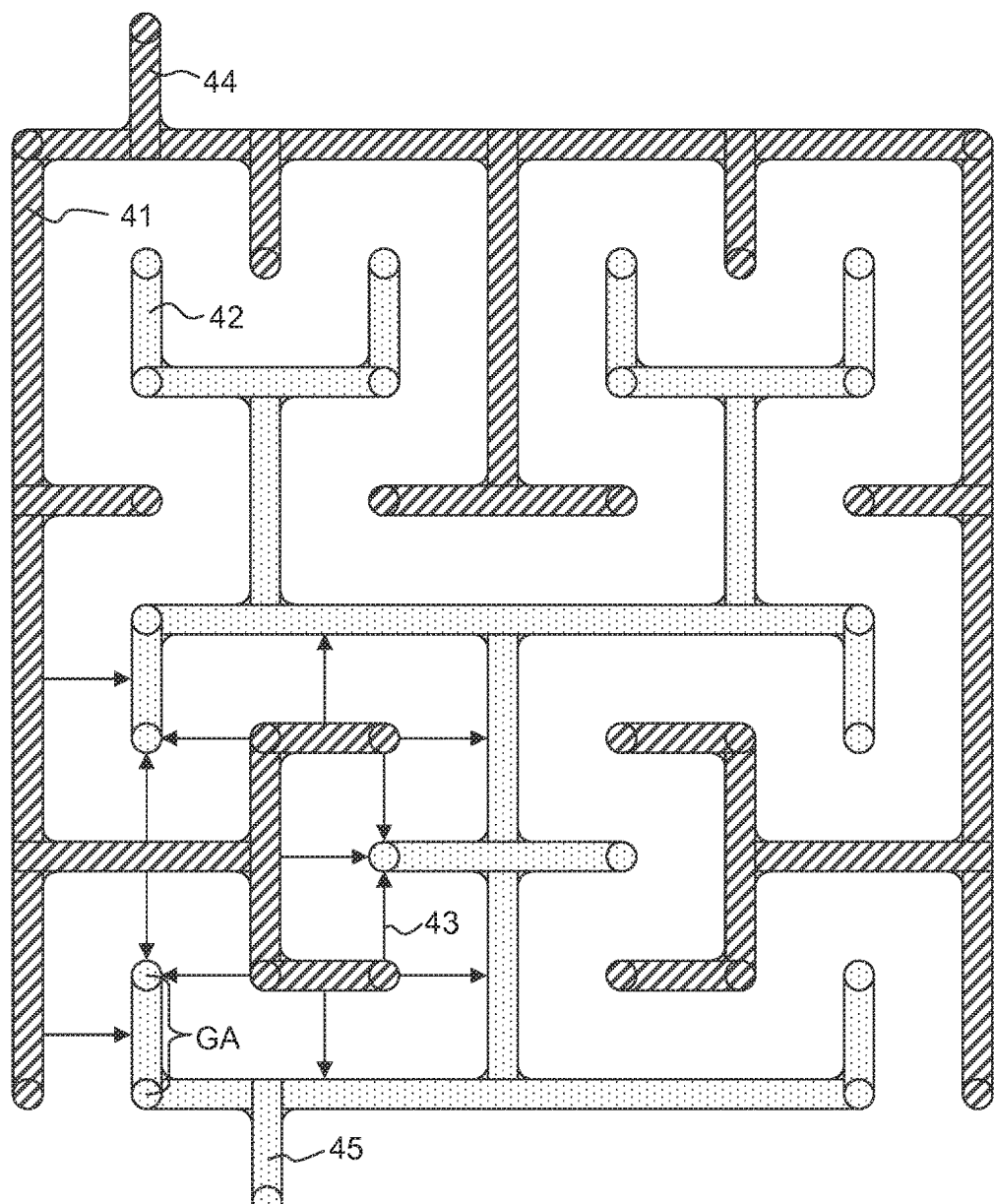
FIG. 5 schematically shows the electrode geometry from FIG. 4, but with rounded-off ends and corners, and also shows resulting electric fields.

FIG. 5 also shows the various orientations of local electric fields (the field line 43 is marked as an example) that are obtained when the electrodes 41, 42 are used at different potentials. The orientations vary over very short distances, such that there is a change in the field direction after approximately one grid spacing GA. Two electrical terminals 44, 45 of the electrodes 41, 42 are also shown, for connection to a high-voltage source (not shown). The terminals 44, 45 are located (at least in part) in the common plane (the drawing plane in this case) of the electrodes 41, 42. The spatial arrangement of the terminals 44, 45 results from the geometric circumstances of the electroadhesion gripper and does not result from the space-filling curve or the border lines thereof. In other words, the electrodes 41, 42 correspond to the border lines of the fractal space-filling curve only in the sub-region in the plan view of the electrodes 41, 42 without the terminals 44, 45.

Figure 6:
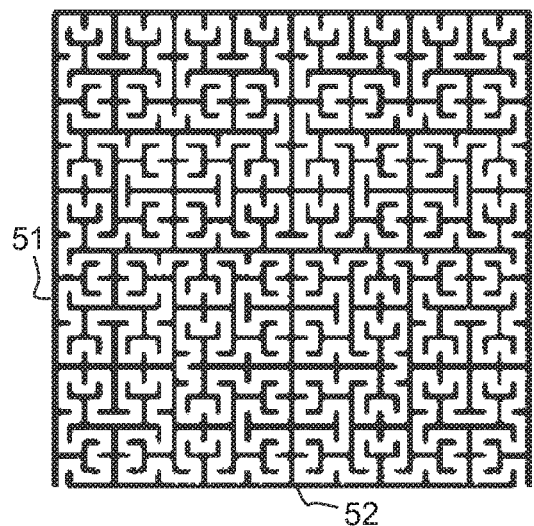
FIG. 6 schematically shows an electrode geometry based on a fourth order Hilbert curve for an electroadhesion gripper.
Figure 7:
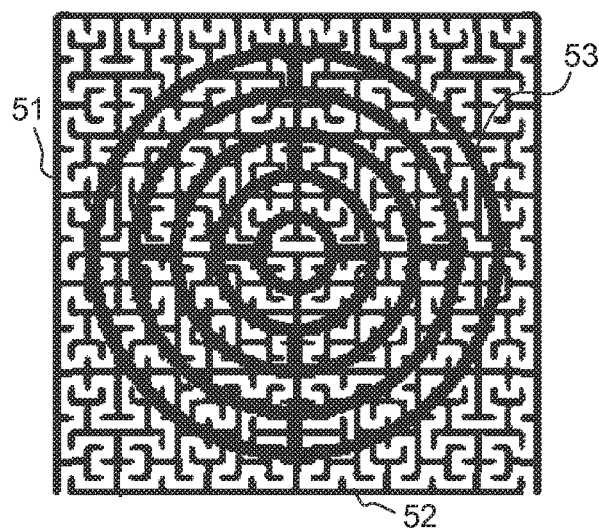
FIG. 7 schematically shows the electrode geometry from FIG. 6, the geometry being covered by a workpiece having a plurality of concentric annular structures.
Figure 8:
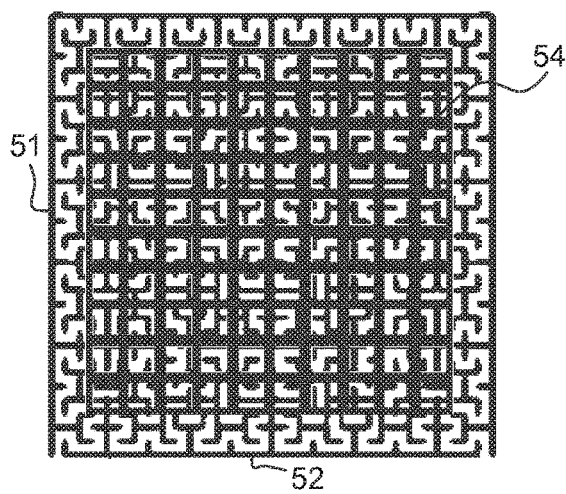
FIG. 8 schematically shows the electrode geometry from FIG. 6, the geometry being covered by a workpiece having a regular grid structure.

FIG. 6 shows an electrode arrangement, including a first electrode 51 and a second electrode 52, formed on the basis of a fourth order Hilbert curve. When covered by a workpiece 53, which in FIG. 7 has a plurality of concentric, annular structures, the electric field lines are to be found in a considerable number (e.g., more than 30) of local electrode gaps having approximately the same proportions in all directions (e.g., in the left-right direction and top-bottom direction). There is no perceptible preferred direction of the holding force in the plane of the electrodes 51, 52 (the drawing plane in this case). When covered by a workpiece 54 having a regular square grid structure, as shown, for example, in FIG. 8, field lines are covered in a considerable number (e.g., more than 30) of local electrode gaps in all orientations and having approximately the same proportions, resulting, in turn, in a large holding force that is substantially the same in all directions.

Figure 9A:
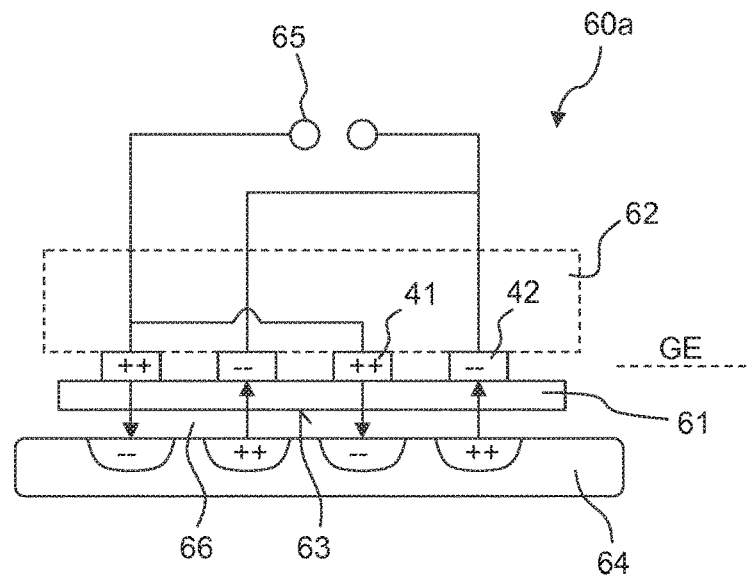
FIG. 9A schematically shows a cross section of an electroadhesion gripper when gripping a workpiece, with a first and a second electrode in a common plane.

FIG. 9A schematically shows an electroadhesion gripper 60a in cross section. Two electrodes 41, 42 are printed on an insulating film 61 (e.g., a dielectric film), for example made of polyester (PET), polyethylene naphthalate (PEN), or polyimide (PI), and have a geometry as shown in FIG. 4 or FIG. 5, for example. Note that each electrode 41, 42 has been cut multiple times in the cross section shown, but the relevant electrode 41, 42 is interconnected within itself, and therefore all the electrode parts of the same electrode 41, 42 are at the same potential (indicated in this case by the electrical connections of the electrode parts). The electrodes 41, 42 (other than supply lines) are arranged in a common plane GE in the embodiment shown. The insulating film 61 including electrodes 41, 42 is fastened to a holding structure 62 (also referred to as a support structure), the insulating film 61 covering the electrodes 41, 42 towards the outside. In addition, the electrodes 41, 42 are generally also electrically insulated with respect to the holding structure 62, for example by an additional insulating film (not shown in more detail). The front side of the insulating film 61 forms a gripping surface 63 (also referred to as an adhesion surface) to which a workpiece 64 (a metal sheet in this figure) can be applied. The electrode 41 is, for example, switched to a positive potential and the electrode 42 is switched to a negative potential by a high-voltage source 65. The electrodes 41, 42 in this case induce opposite charges across an air gap 66, which opposite charges each have an opposite sign in the workpiece 64, as a result of which there is electrostatic attraction between the electroadhesion gripper 60a and the workpiece 64. Accordingly, the workpiece 64 is held on the electroadhesion gripper 60a so long as the high voltage is applied to the electrodes 41, 42. The electroadhesion gripper 60a is usually designed to have an automation unit (for example a robotic arm) (not shown in more detail) to transport the workpiece 64.

Figure 9B:
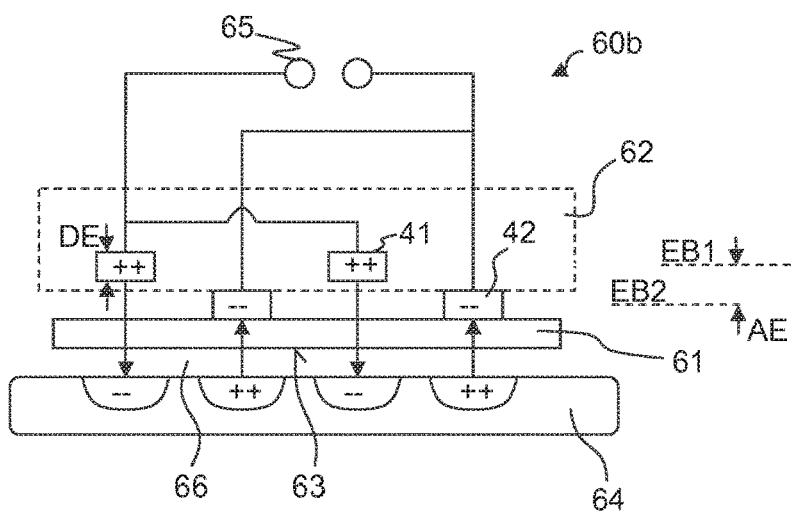
FIG. 9B schematically shows a cross section of an electroadhesion gripper when gripping a workpiece, with a first and a second electrode in spaced apart coplanar planes.

FIG. 9B schematically shows an alternative electroadhesion gripper 60b in cross section. In contrast with the electroadhesion gripper 60a from FIG. 9A, in this case, the electrode 41 is in a first plane EB1 (within the holding structure 62 in the embodiment shown) and the second electrode 42 is in a second plane EB2 and is printed onto the insulating film 61. The planes EB1, EB2 are coplanar (parallel to one another), and the electrodes 41, 42 are arranged one behind the other. A spacing AE between the planes EB1, EB2, measured in each case from center-to-center of the electrodes 41, 42, is in this case slightly larger than the thickness DE of the electrodes 41, 42.

When viewing the electroadhesion gripper 60a, 60b from the side of the gripping surface 63 (adhesion surface) in the direction perpendicular to the gripping surface 63 (adhesion surface), this plan view of or projection onto the gripping surface 63 (adhesion surface) results in the electrode geometry, as shown for instance in FIG. 4 or FIG. 5.

Figure 10:
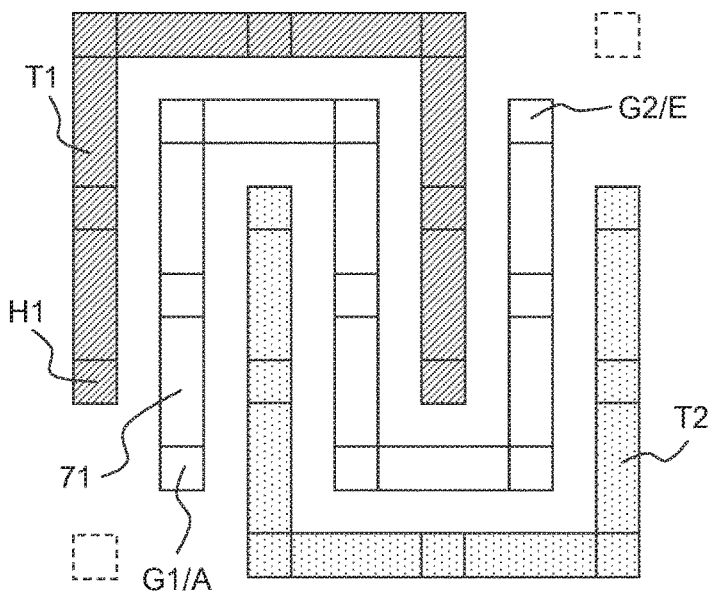
FIG. 10 schematically shows a first order Peano curve with surrounding border lines, to explain the construction of an additional electrode geometry.
Figure 11:
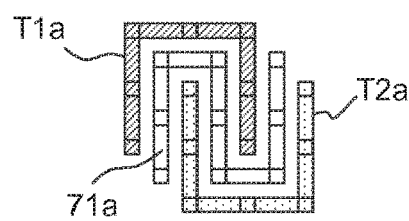
FIG. 11 schematically shows the Peano curve from FIG. 10, downscaled by a factor of 3.
Figure 12:
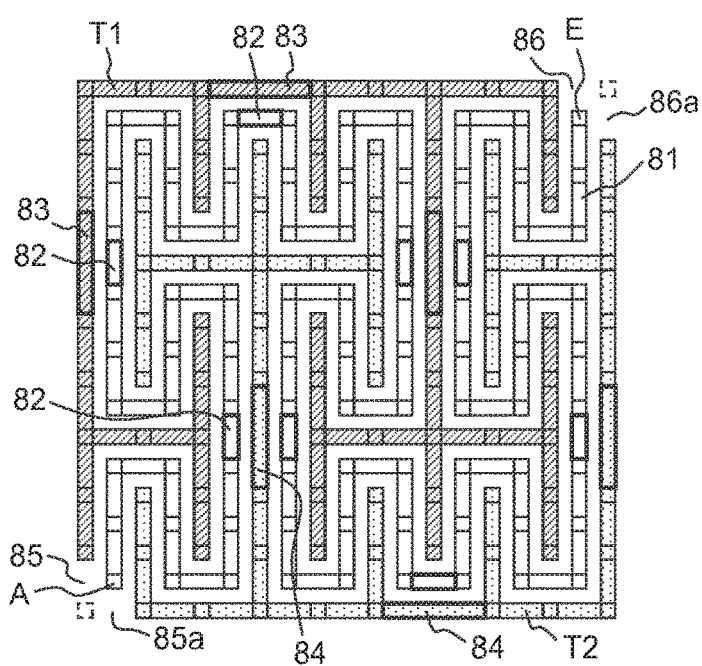
FIG. 12 schematically shows a second order Peano curve with surrounding border lines, to explain the construction of the additional electrode geometry.

FIGS. 10 to 12 explain the construction of electrode geometries on the basis of a Peano curve. FIG. 10 shows a first order Peano curve 71 that is based on a total of nine grid points (indicated as empty white squares) of a grid in a 3×3 arrangement. The grid point G1, which simultaneously represents the starting point A of the first order Peano curve 71, and the grid point G2, which simultaneously represents the end point E thereof, are indicated by way of example. The grid points are linearly interconnected by the Peano curve; the first order (first iteration) Peano curve 71 is approximately S-shaped.

Auxiliary grid points (cross-hatched, doted, and dashed squares) can be arranged so as to be offset by half a grid spacing in each grid direction, with the auxiliary grid point H1 thereof being indicated as an example. The connections of the straight adjacent auxiliary grid points define border lines of the Peano curve 71 (unless they would cross the Peano curve 71). Furthermore, the outer connections adjacent to the starting point A and the end point E are omitted. The parts T1 (in cross-hatches) and T2 (in dots) of the border lines are produced accordingly.

By replacing the grid points with a first order Peano curve 71a that has in this case been downscaled by a factor of 3, see FIG. 11, the second order Peano curve 81 can be obtained, see FIG. 12. The downscaled Peano curves are each oriented, in this case by mirroring, such that the connections of the original first order Peano curve 71 can be established; the connections 82 (having thick edges) of the second order Peano curve 81 can be seen in this respect.

If the second order Peano curve 81 is put together so as to include the parts T1a, T2a of the border lines belonging to the downscaled first order Peano curve 71a (FIG. 11), the border lines should also be connected by connections 83, 84 to obtain the parts T1, T2 of the second order Peano curve 81, as shown in FIG. 12. The same border lines or the parts T1, T2 thereof can be obtained by the auxiliary grid points (squares with cross-hatches, dots, and dashes) that result from shifting the grid points (white squares) by half a grid spacing in each grid direction, by connecting straight adjacent auxiliary grid points whilst avoiding crossing the Peano curve 81 and leaving open in each case the two outer connections 85, 85a, 86, 86a at the starting point A and at the end point E of the Peano curve 81.

The two separate parts T1 (in cross-hatches) and T2 (in dots) of the border lines of the second order Peano curve 81 can be used as the electrode geometry for an electroadhesion gripper as described herein.

OTHER EMBODIMENTS

A number of embodiments of the invention have been described. Nevertheless, it will be understood that various modifications may be made without departing from the spirit and scope of the invention. Accordingly, other embodiments are within the scope of the following claims.

What is claimed is:

1. An electroadhesion gripper for holding workpieces, comprising:
   a first electrode and a second electrode that mutually engage, in a plan view of the electrodes,
   wherein, at least in a sub-region, the first electrode and the second electrode correspond to border lines of a two-dimensional fractal space-filling curve of a second or higher order, and
   wherein the border lines result from enclosing a shape of the space-filling curve on both sides on an auxiliary grid that is offset with respect to a grid of the space-filling curve by half a grid spacing in each grid direction.

2. The electroadhesion gripper of claim 1, wherein the first electrode and the second electrode correspond to a first part and a second part of the border lines of the space-filling curve, the first part and the second part of the border lines being separated from one another in a region of a starting point and in a region of an end point of the space-filling curve.

3. The electroadhesion gripper of claim 1, wherein the space-filling curve is of a third or higher order.

4. The electroadhesion gripper of claim 3, wherein the space-filling curve is of a fourth or higher order.

5. The electroadhesion gripper of claim 1, wherein the space-filling curve is a Hilbert curve.

6. The electroadhesion gripper of claim 1, wherein the electroadhesion gripper has exactly two electrodes.

7. The electroadhesion gripper of claim 1, wherein the first electrode and the second electrode are rounded-off at ends, corners, or both ends and corners of the respective border lines thereof.

8. The electroadhesion gripper of claim 1, wherein the first electrode and the second electrode are rounded-off at ends and corners of the respective border lines thereof.

9. The electroadhesion gripper of claim 1, wherein a smallest spacing between the first electrode and the second electrode, in the plan view of the electrodes, is 3.0 mm or less.

10. The electroadhesion gripper of claim 1, wherein a smallest spacing between the first electrode and the second electrode, in the plan view of the electrodes, is 1.0 mm or less.

11. The electroadhesion gripper of claim 1, wherein a smallest spacing between the first electrode and the second electrode, in the plan view of the electrodes, is 0.3 mm or less.

12. The electroadhesion gripper of claim 1, wherein the first electrode and the second electrode have a uniform width in the sub-region, in the plan view of the electrodes.

13. The electroadhesion gripper of claim 1, wherein in the sub-region, in the plan view of the electrodes, one or both of the first electrode and the second electrode are printed onto a dielectric insulating film, and the film is glued to a holding structure.

14. The electroadhesion gripper of claim 1, wherein the first electrode and the second electrode are arranged in a common plane in the sub-region.

15. The electroadhesion gripper of claim 1, wherein the first electrode is arranged in a first plane and the second electrode is arranged in a second plane, wherein the first plane and the second plane are coplanar and spaced apart.

16. The electroadhesion gripper of claim 1, wherein the border lines are interrupted at two or more points for a division into the two electrodes.

17. The electroadhesion gripper of claim 16, wherein the division into the two electrodes is due to the starting point and the end point of the space-filling curve being not completely enclosed.

18. The electroadhesion gripper of claim 1, wherein the space-filling curve is a Peano curve.

* * * * *